United States Patent
Akimoto et al.

(10) Patent No.: US 9,679,688 B2
(45) Date of Patent: Jun. 13, 2017

(54) MAGNETIC TAPE AND SHIELD CABLE

(71) Applicant: Hitachi Metals, Ltd., Tokyo (JP)

(72) Inventors: Katsuya Akimoto, Hitachi (JP);
Naofumi Chiwata, Mito (JP); Yosuke Sumi, Hitachinaka (JP); Katsutoshi Nakatani, Hitachi (JP); Kenji Ajima, Hitachiota (JP); Hiroshi Okikawa, Hitachi (JP); Yasuharu Muto, Kitaibaraki (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/915,157

(22) PCT Filed: Feb. 27, 2014

(86) PCT No.: PCT/JP2014/054952
§ 371 (c)(1),
(2) Date: Feb. 26, 2016

(87) PCT Pub. No.: WO2015/129001
PCT Pub. Date: Sep. 3, 2015

(65) Prior Publication Data
US 2016/0211060 A1    Jul. 21, 2016

(51) Int. Cl.
*H01F 1/147* (2006.01)
*H05K 9/00* (2006.01)
*H01B 11/10* (2006.01)

(52) U.S. Cl.
CPC ..... *H01F 1/14775* (2013.01); *H01B 11/1008* (2013.01); *H05K 9/0098* (2013.01)

(58) Field of Classification Search
CPC ..... H01F 1/147; H01F 1/14775; H01B 11/10; H01B 11/1008
See application file for complete search history.

(56) References Cited

U.S. PATENT DOCUMENTS

| 714,429 | A | * | 11/1902 | Witzenmann | ........... F16L 11/16 138/136 |
| 1,068,553 | A | * | 7/1913 | Abell | ....................... F16L 11/16 138/135 |

(Continued)

FOREIGN PATENT DOCUMENTS

JP    S 62-190609 A    8/1987

OTHER PUBLICATIONS

International Search Report (ISR) (PCT Form PCT/ISA/210), in PCT/JP2014/054952, dated Jun. 3, 2014.
(Continued)

*Primary Examiner* — Timothy Thompson
*Assistant Examiner* — Michael F McAllister
(74) *Attorney, Agent, or Firm* — McGinn IP Law Group, PLLC

(57) ABSTRACT

A shield cable includes an insulated electrical cable of a conductor wire sheathed about the circumference by an insulator, and a magnetic tape layer formed by wrapping magnetic tape about the circumference of the insulated electrical cable. The magnetic tape is a magnetic tape shaped by continuously cutting to constant width an elongated sheet comprising a magnetic material. The magnetic tape, on at least the insulated electrical cable-facing surface thereof, has grooves extending in the lengthwise direction, for accommodating at least one of pairs of burrs that are formed at both widthwise edge surfaces during cutting of the elongated sheet.

8 Claims, 4 Drawing Sheets

(56) References Cited

U.S. PATENT DOCUMENTS

| | | | | |
|---|---|---|---|---|
| 3,474,186 | A | * | 10/1969 | Hale .................... H01B 9/023 |
| | | | | 174/103 |
| 4,800,928 | A | * | 1/1989 | Kanao ................... F16L 11/16 |
| | | | | 138/122 |
| 4,816,614 | A | | 3/1989 | Baigrie et al. |
| 6,143,406 | A | * | 11/2000 | Uchida ............... H05K 9/0018 |
| | | | | 427/127 |
| 7,880,576 | B2 | * | 2/2011 | Matsuzaki ............. H01F 17/06 |
| | | | | 174/36 |

OTHER PUBLICATIONS

English Translation of the International Preliminary Report on Patentability in PCT Application No. PCT/JP2014/054952 dated Sep. 9, 2016.

* cited by examiner

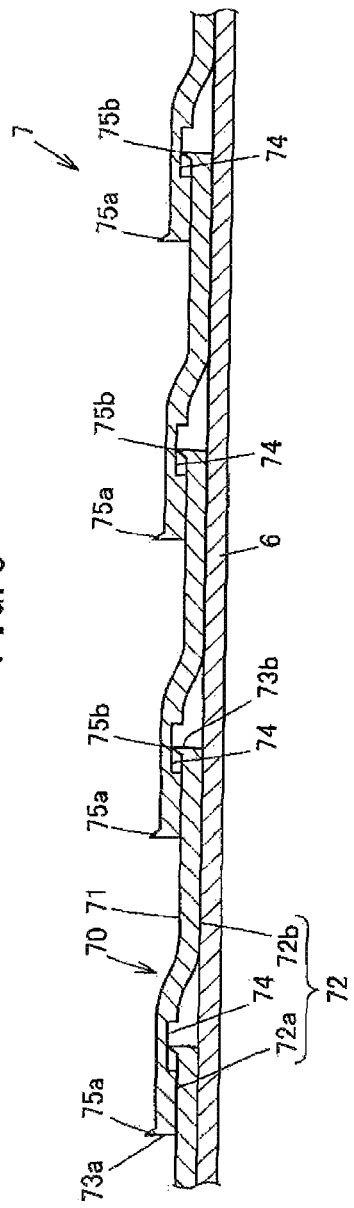
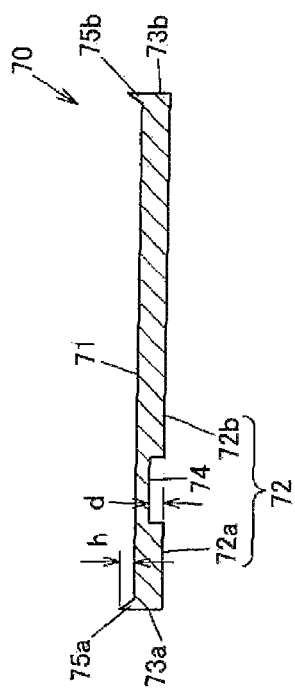

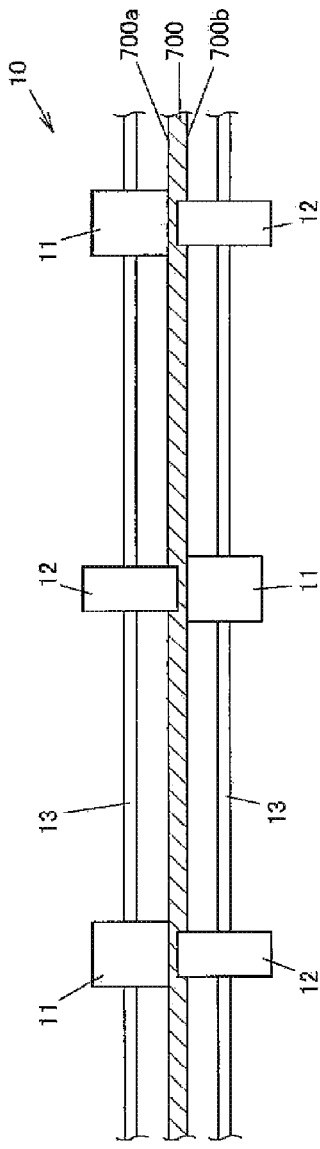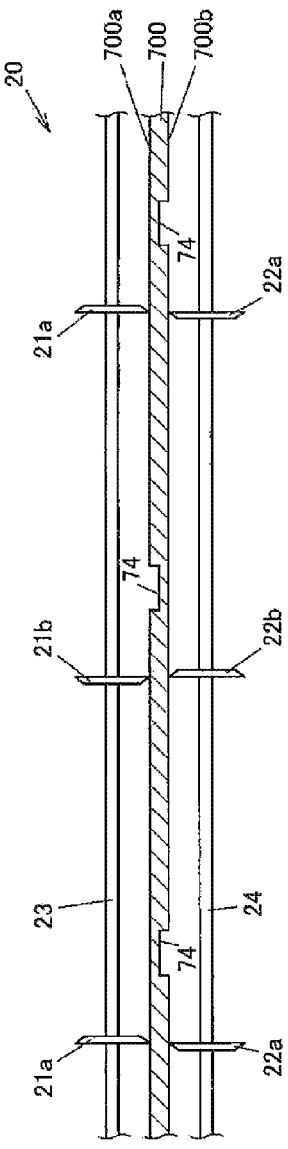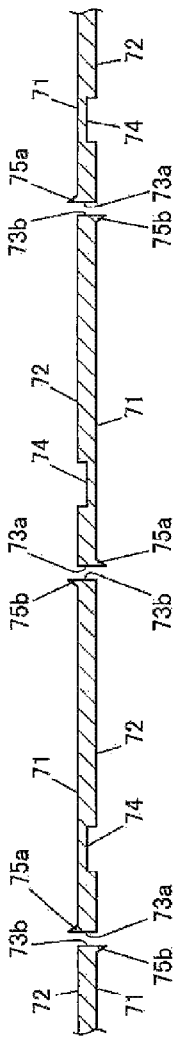

MAGNETIC TAPE AND SHIELD CABLE

TECHNICAL FIELD

The present invention relates to a magnetic tape and a shield cable.

BACKGROUND ART

A conventional high-frequency attenuation cable capable of preventing EMI (electromagnetic interference) has been proposed (see, e.g., PTL 1).

In this high-frequency attenuation cable, a magnetic tape formed of a magnetic material is helically wound around a conductor wire so as to partially overlap. In this configuration, electromagnetic noise emitted from the conductor wire is attenuated by the magnetic tape, and it is also possible to maintain flexibility. The magnetic tape is generally formed by a slitting process, i.e., by cutting a long and wide sheet to a constant width, which is then wound on a roller or reel.

CITATION LIST

Patent Literature

PTL 1

JP-A 62-190609

SUMMARY OF INVENTION

Technical Problem

In the conventional high-frequency attenuation cable, however, burrs are formed on both widthwise end faces at the time of slitting. Therefore, the magnetic tape when helically wound is lifted up since the tips of burrs come into contact with the surface of the tape and this may cause a decrease in effective magnetic permeability.

Therefore, it is an object of the invention to provide a magnetic tape and a shield cable which are not susceptible to uplifting of tape wrapped about a conductor wire, and with which decline in effective magnetic permeability can be reduced as a result.

Solution to Problem

To solve the above-mentioned problems, the invention provides a magnetic tape formed by continuously cutting to constant width an elongated sheet comprising a magnetic material, the magnetic tape comprising a groove in at least a back surface and in a lengthwise direction to accommodate at least one of a pair of burrs that are formed at both widthwise edge surfaces in the cutting of the elongated sheet.

To solve the above-mentioned problems, the invention also provides a magnetic tape shaped by continuously cutting to constant width an elongated sheet that comprises a magnetic material and a resin layer on a back surface, the magnetic tape comprising a groove in at least the back surface and in the lengthwise direction to accommodate at least one of a pair of burrs that are formed at both widthwise edge surfaces in the cutting of the elongated sheet.

The magnetic material may comprise an amorphous alloy. Alternatively, the magnetic material may comprise a nanocrystalline soft magnetic alloy obtained by performing heat treatment for nanocrystallization on an amorphous alloy containing Fe, Si, B and Cu and further containing at least one element selected from Ti, V, Zr, Nb, Mo, Hf, Ta and W.

To solve the above-mentioned problems, the invention provides a shield cable comprising an insulated electrical cable comprising a conductor wire and an insulation covering a circumference of the conductor wire, and a magnetic tape layer formed by wrapping a magnetic tape on the circumference of the insulated electrical cable, wherein the magnetic tape is formed by continuously cutting to constant width an elongated sheet comprising a magnetic material, and wherein the magnetic tape comprises a groove in at least a surface to face the insulated electrical cable and in the lengthwise direction to accommodate at least one of a pair of burrs formed at both widthwise edge surfaces in the cutting of the elongated sheet.

To solve the above-mentioned problems, the invention also provides a shield cable comprising an insulated electrical cable comprising a conductor wire and an insulation covering a circumference of the conductor wire, and a magnetic tape layer formed by wrapping a magnetic tape on the circumference of the insulated electrical cable, wherein the magnetic tape is formed by continuously cutting to constant width an elongated sheet comprising a magnetic material and a resin layer formed on a surface on a side of the insulated electrical cable, and wherein the magnetic tape comprises a groove in at least the surface on the side of the insulated electrical cable and in the lengthwise direction to accommodate at least one of a pair of burrs formed at both widthwise edge surfaces in the cutting of the elongated sheet.

The magnetic material constituting the magnetic tape may comprise an amorphous alloy. Alternatively, the magnetic material constituting the magnetic tape may comprise a nanocrystalline soft magnetic alloy obtained by performing heat treatment for nanocrystallization on an amorphous alloy containing Fe, Si, B and Cu and further containing at least one element selected from Ti, V, Zr, Nb, Mo, Hf, Ta and W.

Advantageous Effects of Invention

According to the invention, a tape wound around a conductor wire is less likely to be lifted up and this allows a decline in effective magnetic permeability to be reduced.

BRIEF DESCRIPTION OF DRAWINGS

FIG. 3 is a partial cross sectional view showing the state in which a magnetic tape in the first embodiment is wound around a periphery of a resin tape layer.

FIG. 4 is a cross sectional view showing the magnetic tape shown in FIG. 3.

FIG. 5A is a cross sectional view showing an example process of manufacturing the magnetic tape in the first embodiment.

FIG. 5B is a cross sectional view showing the example process of manufacturing the magnetic tape in the first embodiment.

FIG. 5C is a cross sectional view showing the example process of manufacturing the magnetic tape in the first embodiment.

DESCRIPTION OF EMBODIMENT

Figure 1:
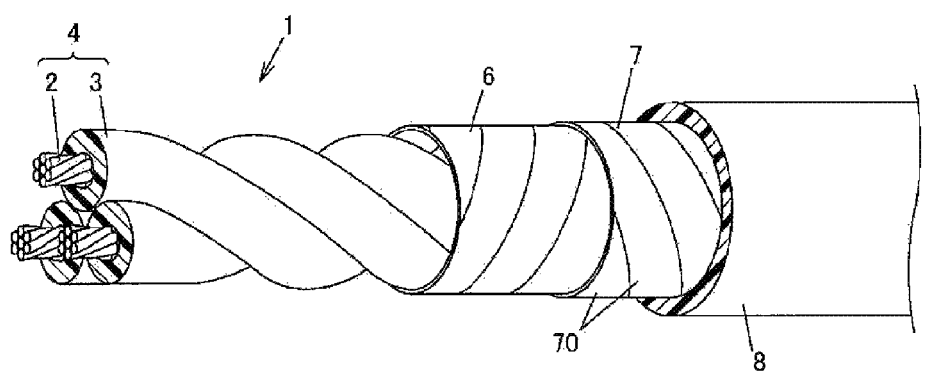
FIG. 1 is a schematic perspective view showing a configuration of a shield cable in a first embodiment of the present invention.

Embodiments of the invention will be described below in reference to the drawings. Constituent elements having substantially the same functions are denoted by the same reference numerals in each drawing and the overlapping explanation thereof will be omitted.

First Embodiment

Figure 2:
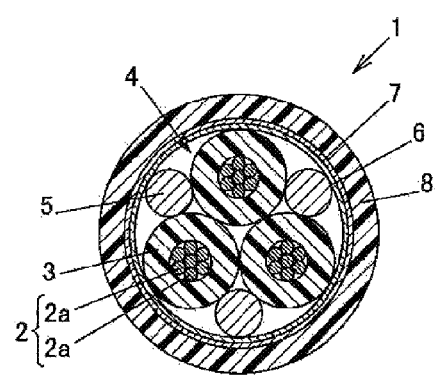
FIG. 2 is a cross sectional view showing the shield cable shown in FIG. 1.

FIG. 1 is a schematic perspective view showing a configuration of a shield cable in the first embodiment of the invention. FIG. 2 is a cross sectional view showing the shield cable shown in FIG. 1. Note that, the illustration of inclusions 5 is omitted in FIG. 1.

A shield cable 1 is provided with plural (three in the present embodiment) insulated electrical cables 4 each formed by covering a conductor wire 2 with an insulator 3, a resin tape layer 6 formed around the plural insulated electrical cables 4 with inclusions 5 interposed therebetween, a magnetic tape layer 7 provided around the periphery of the resin tape layer 6, and a sheath 8 as an insulating protective layer formed of a resin, etc., and provided around the magnetic tape layer 7.

The conductor wire 2 is formed by twisting plural (seven in the present embodiment) thin metal wires 2a together. The insulated electrical cable 4 transmits, e.g., a signal of 100 MHz to 10 GHz or power with a carrier frequency of not more than 10 MHz. Alternatively, the conductor wire 2 may be a solid wire. Meanwhile, although the plural insulated electrical cables 4 are provided in the present embodiment, the number thereof may be one. In addition, the insulated electrical cable 4 may be a twisted pair wire which transmits a differential signal.

The resin tape layer 6 is formed by winding a resin tape around the plural insulated electrical cables 4 with the inclusions 5 interposed therebetween throughout the longitudinal direction of the cable. The resin tape used can be, e.g., a tape formed of a resin such as polyethylene terephthalate (PET) or polypropylene-based resin.

The magnetic tape layer 7 is formed by, e.g., helically winding a magnetic tape 70 formed of a magnetic material around the periphery of the resin tape layer 6 throughout the longitudinal direction of the cable.

The sheath 8 is formed of, e.g., a vinyl chloride resin, an ethylene vinyl acetate polymer, a fluorine-based resin or a silicone-based resin, etc.

(Configuration of Magnetic Tape Layer)

FIG. 3 is a partial cross sectional view showing the state in which the magnetic tape 70 is wound around the periphery of the resin tape layer 6. FIG. 4 is a cross sectional view showing the magnetic tape 70 shown in FIG. 3.

The magnetic tape 70 is formed by continuously slitting (cutting) an elongated sheet of a magnetic material at a constant width. On a back surface 72 which is located opposite to a front surface 71, the magnetic tape 70 has a groove 74 along the longitudinal direction to accommodate a burr 75b which is one of a pair of burrs 75a and 75b formed at both widthwise edge surfaces 73a and 73b during cutting of the elongated sheet. The groove 74 is formed at a position on the edge surface 73a side with respect to the widthwise center of the magnetic tape 70, i.e., at a position at which the burr 75b gets in the groove 74 when the magnetic tape 70 is helically wound around the periphery of the resin tape layer 6. Then, when the magnetic tape 70 is wound around the periphery of the resin tape layer 6, a first back surface 72a as a divided portion of the back surface 72 on one side of the groove 74 comes into contact with the front surface 71 of the magnetic tape 70 and a second back surface 72b on the other side comes into contact with the resin tape layer 6. Since the helically wound magnetic tape 70 is in surface-contact with itself, electromagnetic noise is less likely to leak and it is possible to reduce a decline in effective magnetic permeability.

The magnetic material to form the magnetic tape 70 is preferably a soft magnetic material having low magnetic coercivity and high magnetic permeability to reduce electromagnetic noise. The soft magnetic material used can be, e.g., an amorphous alloy such as Co-based amorphous alloy or Fe-based amorphous alloy, a ferrite such as Mn—Zn ferrite, Ni—Zn ferrite or Ni—Zn—Cu ferrite, a soft magnetic metal such as Fe—Ni alloy (permalloy), Fe—Si—Al alloy (sendust) or Fe—Si alloy (silicon steel), or, nanocrystalline soft magnetic alloy powder obtained by performing heat treatment for nanocrystallization on an amorphous alloy containing Fe, Si, B and Cu and further containing at least one element selected from Ti, V, Zr, Nb, Mo, Hf, Ta and W. Of these soft magnetic materials, the nanocrystalline soft magnetic alloy powder is preferable since the relative magnetic permeability thereof is as large as that of a Co-based amorphous alloy and change in the relative magnetic permeability over time is small.

It is possible to use the magnetic tape 70 having, e.g., a thickness of 25 μm, 50 μm or 75 μm and a width of 10 to 20 mm To accommodate the burr 75a or 75b having a height h (e.g., about 10 μm), a depth of the groove 74 is preferably not less than half and not more than 5 times, more preferably, not less than four fifth and not more than double the average height of the burr 75a and 75b (e.g., an average of values measured on 10 points on each side, 20 points in total, in length of 1 meter by a micrometer). Considering winding accuracy or misalignment of the magnetic tape 70 in a length direction of the cable when the cable is bent, the width of the groove 74 is preferably, e.g., not less than 1 mm and not more than 3 mm (Process of Manufacturing Magnetic Tape)

FIGS. 5A to 5C are cross sectional views showing an example process of manufacturing the magnetic tape 70 in the first embodiment. The process of manufacturing the magnetic tape 70 formed of an amorphous alloy will be described below as an example.

Firstly, as shown in FIG. 5A, a wide magnetic sheet 700 alloyed and amorphized is fed to pass through a grooving machine 10 in which the grooves 74 are formed by rolling. The grooving machine 10 is provided with holding rollers 11 for holding the magnetic sheet 700, processing rollers 12 provided opposite to the holding rollers 11 to form the grooves 74, shafts 13 rotatably coupling and integrating the holding rollers 11 and the processing rollers 12, and a motor (not shown) for rotating the shafts 13. The grooves 74 are formed alternately on a front surface 700a and a back surface 700b of the magnetic sheet 700 along the width direction. Alternatively, the grooving machine 10 may be configured to form the grooves 74 by scraping.

Next, as shown in FIG. 5B, the amorphized magnetic sheet 700 is fed to pass through a slitting machine 20 to form the magnetic tapes 70 having a smaller width than the magnetic sheet 700. The slitting machine 20 is provided with upper cutters 21*a* and 21*b* arranged on the front surface 700*a* side of the magnetic sheet 700, lower cutters 22*a* and 22*b* arranged on the back surface 700*b* side of the magnetic sheet 700, a shaft 23 rotatably coupling and integrating the upper cutters 21*a* and 21*b*, a shaft 24 rotatably coupling and integrating the lower cutters 22*a* and 22*b*, and a motor for rotating the shafts 23 and 24 in a synchronized manner. Each clearance between the upper cutter 21*a* and the lower cutter 22*a* and that between the upper cutter 21*b* and the lower cutter 22*b* are adjusted to minimize the burrs 75*a* and 75*b*. In addition, a pair of upper cutters 21*a* and 21*b* are arranged inside or outside, depending on which magnetic tape 70, of a pair of lower cutters 22*a* and 22*b* so that the burrs 75*a* and 75*b* formed on the both widthwise edge surfaces 73*a* and 73*b* protrude in the same direction.

The magnetic tapes 70 obtained through the slitting process in the slitting machine 20 have the burrs 75*a* and 75*b* on the both edge surfaces 73*a* and 73*b*, as shown in FIG. 5C. Each magnetic tape 70 is then wound on a roller or reel.

(Functions and Effects of the First Embodiment)

The following functions and effects are obtained in the first embodiment.

(1) When the magnetic tape 70 is helically wound around the periphery of the resin tape layer 6, the burr 75*b* gets in the groove 74 and the magnetic tape 70 comes into surface-contact with itself. Therefore, the magnetic tape 70 is less likely to be lifted up and it is thereby possible to reduce a decline in effective magnetic permeability.

(2) The magnetic tape layer 7 absorbs a magnetic field of electromagnetic noise generated by the insulated electrical cables 4 and thereby reduces electromagnetic noise emission.

(3) Since the magnetic tape layer 7 is formed by helically winding the magnetic tape 70, it is possible to provide a shield cable excellent in bending properties.

Second Embodiment

Figure 6:
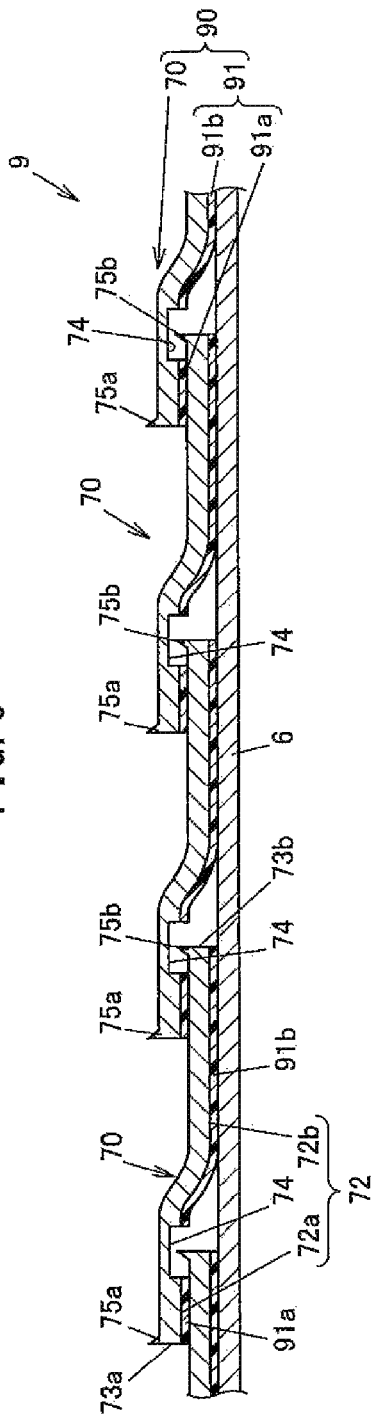
FIG. 6 is a partial cross sectional view showing the state in which a magnetic tape in a second embodiment of the invention is wound around the periphery of the resin tape layer.
Figure 7:
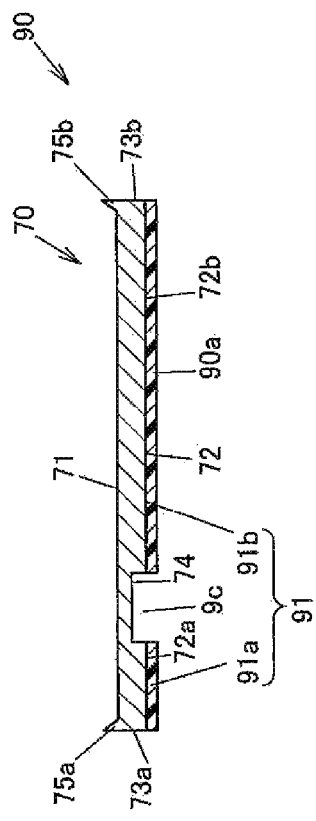
FIG. 7 is a cross sectional view showing the magnetic tape shown in FIG. 6.

FIG. 6 is a partial cross sectional view showing the state in which a magnetic tape in a second embodiment of the invention is wound around the periphery of the resin tape layer. FIG. 7 is a cross sectional view showing the magnetic tape shown in FIG. 6.

In the first embodiment, the magnetic tape layer 7 is formed using the magnetic tape 70 not having a resin layer on the back surface 72. In second embodiment, a resin layer-coated magnetic tape layer 9 is formed using a resin layer-coated magnetic tape 90 obtained by providing a resin layer 91 on the back surface 72 of the magnetic tape 70. Here, the resin layer-coated magnetic tape 90 is one example of the magnetic tape and the resin layer-coated magnetic tape layer 9 is one example of the magnetic tape layer.

The resin layer-coated magnetic tape layer 9 in the second embodiment is formed by, e.g., helically winding the resin layer-coated magnetic tape 90 around the periphery of the resin tape layer 6 throughout the longitudinal direction of the cable so that the resin layer 91 faces the resin tape layer 6.

To form the resin layer 91, it is possible to use a resin, e.g., polyethylene terephthalate (PET) or polypropylene-based resin, etc.

The resin layer-coated magnetic tape 90 is formed by, e.g., continuously slitting (cutting) an elongated sheet of a magnetic material with resin layers on both sides at a constant width. On a back surface 90*a*, the resin layer-coated magnetic tape 90 has the groove 74 which is formed along the longitudinal direction and has a depth d capable of accommodating the burr 75*b* which is one of the pair of burrs 75*a* and 75*b* formed at the both widthwise edge surfaces 73*a* and 73*b* during cutting of the elongated sheet. The groove 74 is formed at a position on the edge surface 73*a* side with respect to the widthwise center of the resin layer-coated magnetic tape 90, i.e., at a position at which the burr 75*b* gets in the groove 74 when the resin layer-coated magnetic tape 90 is helically wound around the periphery of the resin tape layer 6. Then, when the resin layer-coated magnetic tape 90 is wound around the periphery of the resin tape layer 6, the first back surface 72*a* as a divided portion of the back surface 72 on one side of the groove 74 comes into contact with the front surface 71 of the magnetic tape 70 via a resin layer 91*a* and the second back surface 72*b* on the other side comes into contact with the resin tape layer 6 via a resin layer 91*b*. The resin layer 91 has a thickness of, e.g., 5 to 10 µm. Since the helically wound resin layer-coated magnetic tape 90 faces itself via the thin resin layer 91*a*, electromagnetic noise is less likely to leak and it is possible to reduce a decline in effective magnetic permeability.

(Process of Manufacturing Magnetic Tape)

Firstly, as shown in FIG. 5A, the wide magnetic sheet 700 alloyed and amorphized is fed to pass through the grooving machine 10 in which the grooves 74 are formed by rolling.

Next, the resin layer 91 is formed on both surfaces of the magnetic sheet 700 on which the grooves 74 are formed. Here, the resin layer 91 may be formed except in the grooves 74, or the resin layer 91 may be firstly formed on the entire surface, followed by removal of a portion in the grooves 74 by etching, etc.

Next, as shown in FIG. 5B, the amorphized magnetic sheet 700 is fed to pass through the slitting machine 20 to form the magnetic tapes 70 having a smaller width than the magnetic sheet 700.

The magnetic tapes 70 obtained through the slitting process in the slitting machine 20 have the burrs 75*a* and 75*b* on the both edge surfaces 73*a* and 73*b* as shown in FIG. 5C after removing the resin layer on the side not having the grooves 74. Each magnetic tape 70 is then wound on a roller or reel.

(Functions and Effects of the Second Embodiment)

The following functions and effects are obtained in the second embodiment.

(1) When the resin layer-coated magnetic tape 90 is helically wound around the periphery of the resin tape layer 6, the burr 75*b* gets in the groove 74 and the resin layer-coated magnetic tape 90 comes into surface-contact with itself. Therefore, the resin layer-coated magnetic tape 90 is less likely to be lifted up and it is thereby possible to reduce a decline in effective magnetic permeability.

(2) The resin layer-coated magnetic tape layer 9 absorbs a magnetic field of electromagnetic noise generated by the insulated electrical cables 4 and thereby reduces electromagnetic noise emission.

(3) Since the resin layer-coated magnetic tape layer 9 is formed by helically winding the resin layer-coated magnetic tape 90, it is possible to provide a shield cable excellent in bending properties.

(4) Since the magnetic sheet has the resin layers on both surfaces at the time of slitting, it is possible to suppress formation of burrs.

The invention is not limited to the above-mentioned embodiments and can be embodied in various forms. For example, although the case where the burrs 75*a* and 75*b* on the both widthwise edge surfaces of the magnetic tape 70 are formed on the front surface 71 side of the magnetic tape 70 has been described in the first and second embodiments, the slitting process may be performed so that the burr 75a is formed on the back surface 72 side and the other burr 75b is formed on the other side. In this case, another groove 74 is formed on the front surface 71 at a position allowing the burr 75a to be accommodated.

In addition, the magnetic material used to form the magnetic tape 70 may be a composite magnetic ribbon for processing characterized in that an amorphous alloy ribbon satisfying Tx>Tc is heat-treated in a temperature range from Tc to Tc+50° C. where Tc is the Curie temperature and Tx is crystallization temperature, and a resin layer is formed on the amorphous alloy ribbon (see Japanese Patent No. 3512109).

The magnetic material used to form the magnetic tape 70 may be an amorphous alloy ribbon which has an alloy composition expressed by $Fe_{100-a-b-c-d}M_aSi_bB_cC_d$ (atom %) ($0<a\leq10$, $8\leq b\leq17$, $5\leq c\leq10$, $0.02\leq d\leq0.8$ and $13<a+b+c+d\leq35$) with an inevitable impurity in which the M is at least one element selected from Ti, V, Zr, Nb, Mo, Hf, Ta and W, and not less than 0.5 atom % and not more than 2 atom % of Fe is substituted for Cu, and characterized in that the C concentration has a peak in a depth range of 2 to 20 nm from the surface of the amorphous alloy ribbon in terms of $SiO_2$ when the element concentration of the amorphous alloy ribbon is measured in a depth direction from the surface by GD-OES (see Japanese Patent No. 5182601).

In addition, another magnetic material which may be used to form the magnetic tape 70 is an amorphous alloy ribbon which has an alloy composition expressed by $Fe_{100-a-b-c-d}M_aSi_bB_cC_d$ (atom %) ($0\leq a\leq10$, $0\leq b\leq20$, $4\leq c\leq20$, $0.1\leq d\leq3$ and $7\leq a+b+c\leq35$) with an inevitable impurity, and characterized in that the M is at least one element selected from Ti, V, Zr, Nb, Mo, Hf, Ta and W, a Cu segregation portion having a higher Cu concentration than the uppermost surface portion is present in the amorphous alloy ribbon on the surface side, and the maximum Cu concentration in the Cu segregation portion is not more than 4 atom % (see Japanese Patent No. 5339192).

Although the magnetic tape layer is formed by helically winding the magnetic tape in each embodiment, it is not limited to the helical form. The magnetic tape layer may be formed by, e.g., braiding the magnetic tape.

In addition, a shield layer using shield wires formed of a conductive material may be provided on the inner side or outer side of the magnetic tape layer 7. In this case, the magnetic tape layer 7 absorbs a magnetic field of electromagnetic noise generated by the insulated electrical cables 4 and thereby shields mainly low-frequency band electromagnetic noise. Meanwhile, the shield layer formed of a conductive material absorbs an electric field of electromagnetic noise generated by the insulated electrical cables 4 and thereby shields mainly high-frequency band electromagnetic noise. As a result, it is possible to provide a highly reliable shield cable suitable for shielding noise in a wide frequency band.

In addition, some of the constituent elements in the embodiments can be omitted or changed without changing the gist of the invention. For example, the inclusions 5 may be omitted as long as no problem arises when winding the rein tape around the plural insulated electrical cables 4.

INDUSTRIAL APPLICABILITY

The invention is suitable for power cables such as three-core power cable for connecting a motor to an inverter, or signal transmission cables such as differential cable for transmitting a differential signal.

REFERENCE SIGNS LIST

1: shield cable
2: conductor wire
2a: thin metal wire
3: insulator
4: insulated electrical cable
5: inclusion
6: resin tape layer
7: magnetic tape layer
8: sheath
9: resin layer-coated magnetic tape layer
10: grooving machine
11: holding roller
12: processing roller
13: shaft
20: slitting machine
21a, 21b: upper cutter
22a, 22b: lower cutter
23, 24: shaft
70: magnetic tape
71: front surface
72, 72a, 72b: back surface
73a, 73b: edge surface
74: groove
75a, 75b: burr
90: resin layer-coated magnetic tape
90a: front surface
91, 91a, 91b: resin layer
700: magnetic sheet
700a: front surface
700b: back surface

The invention claimed is:

1. A magnetic tape formed by continuously cutting to constant width an elongated sheet comprising a magnetic material, the magnetic tape comprising:
a groove in at least a back surface and in a lengthwise direction so as to accommodate at least one of a pair of burrs that are formed at both widthwise edge surfaces in the cutting of the elongated sheet.

2. A magnetic tape formed by continuously cutting to constant width an elongated sheet that comprises a magnetic material and a resin layer on a back surface, the magnetic tape comprising:
a groove in at least the back surface and in a lengthwise direction to accommodate at least one of a pair of burrs that are formed at both widthwise edge surfaces in the cutting of the elongated sheet.

3. The magnetic tape according to claim 1, wherein the magnetic material comprises an amorphous alloy.

4. The magnetic tape according to claim 1, wherein the magnetic material comprises a nanocrystalline soft magnetic alloy obtained by performing heat treatment for nanocrystallization on an amorphous alloy containing Fe, Si, B and Cu and further containing at least one element selected from Ti, V, Zr, Nb, Mo, Hf, Ta and W.

5. A shield cable, comprising:
an insulated electrical cable comprising a conductor wire and an insulation covering a circumference of the conductor wire; and
a magnetic tape layer formed by wrapping a magnetic tape on the circumference of the insulated electrical cable, wherein the magnetic tape is formed by continuously cutting to constant width an elongated sheet comprising a magnetic material, and wherein the magnetic tape comprises a groove in at least a surface to face the insulated electrical cable and in a lengthwise direction to accommodate at least one of a pair of burrs formed at both widthwise edge surfaces in the cutting of the elongated sheet.

6. A shield cable, comprising:

an insulated electrical cable comprising a conductor wire and an insulation covering a circumference of the conductor wire; and a magnetic tape layer formed by wrapping a magnetic tape on the circumference of the insulated electrical cable, wherein the magnetic tape is formed by continuously cutting to constant width an elongated sheet comprising a magnetic material and a resin layer formed on a surface on a side of the insulated electrical cable, and wherein the magnetic tape comprises a groove in at least the surface on the side of the insulated electrical cable and in a lengthwise direction to accommodate at least one of a pair of burrs formed at both widthwise edge surfaces in the cutting of the elongated sheet.

7. The shield cable according to claim 5, wherein the magnetic material constituting the magnetic tape comprises an amorphous alloy.

8. The shield cable according to claim 5, wherein the magnetic material constituting the magnetic tape comprises a nanocrystalline soft magnetic alloy obtained by performing heat treatment for nanocrystallization on an amorphous alloy containing Fe, Si, B and Cu and further containing at least one element selected from Ti, V, Zr, Nb, Mo, Hf, Ta and W.

* * * * *